US00RE49046E

(19) United States
(12) Reissued Patent
Liu et al.

(10) Patent Number: US RE49,046 E
(45) Date of Reissued Patent: *Apr. 19, 2022

(54) METHODS AND APPARATUS FOR PACKAGE ON PACKAGE DEVICES

(71) Applicant: Taiwan Semiconductor Manufacturing Company, Ltd., Hsinchu (TW)

(72) Inventors: Ming-Kai Liu, New Taipei (TW); Kai-Chiang Wu, Hsinchu (TW); Hsien-Wei Chen, Hsinchu (TW); Shih-Wei Liang, Dajia Township (TW)

(73) Assignee: Taiwan Semiconductor Manufacturing Company, Ltd., Hsin-Chu (TW)

( * ) Notice: This patent is subject to a terminal disclaimer.

(21) Appl. No.: 16/014,434

(22) Filed: Jun. 21, 2018

Related U.S. Patent Documents

Reissue of:
(64) Patent No.: 9,373,599
Issued: Jun. 21, 2016
Appl. No.: 14/539,779
Filed: Nov. 12, 2014

U.S. Applications:
(63) Continuation of application No. 13/463,667, filed on May 3, 2012, now Pat. No. 8,901,730.

(51) Int. Cl.

| | |
|---|---|
| ***H01L 23/00*** | (2006.01) |
| ***H01L 23/488*** | (2006.01) |
| ***H01L 23/52*** | (2006.01) |
| ***H01L 21/50*** | (2006.01) |
| ***H01L 23/498*** | (2006.01) |
| ***H01L 25/10*** | (2006.01) |
| ***H01L 25/00*** | (2006.01) |

(52) U.S. Cl.
CPC ..... *H01L 24/17* (2013.01); *H01L 21/50* (2013.01); *H01L 23/488* (2013.01); *H01L 23/49816* (2013.01); *H01L 23/49827* (2013.01); *H01L 23/52* (2013.01); *H01L 24/81* (2013.01); *H01L 25/105* (2013.01); *H01L 25/50* (2013.01)

(58) Field of Classification Search
CPC ..... H01L 24/17; H01L 21/50; H01L 23/488; H01L 23/49816; H01L 23/49827; H01L 23/52; H01L 24/81; H01L 25/105; H01L 25/50
See application file for complete search history.

(56) References Cited

U.S. PATENT DOCUMENTS

| | | | |
|---|---|---|---|
| 5,099,309 | A | 3/1992 | Kryzaniwsky |
| 5,111,278 | A | 5/1992 | Eichelberger |
| 5,644,828 | A | 7/1997 | Degani et al. |
| 5,751,060 | A | 5/1998 | Laine et al. |
| 5,783,870 | A | 7/1998 | Mostafazadeh et al. |
| 5,841,193 | A | 11/1998 | Eichelberger |

(Continued)

*Primary Examiner* — Tuan H Nguyen
(74) *Attorney, Agent, or Firm* — Slater Matsil, LLP

(57) ABSTRACT

Package on package (PoP) devices and methods of packaging semiconductor dies are disclosed. A PoP device is formed by connecting a top package and a bottom package together using a plurality of PoP connectors on the bottom package connected to corresponding connectors of the top package. The PoP device further comprises a plurality of dummy connectors contained in the bottom package and not connected to any corresponding connector in the top package.

37 Claims, 8 Drawing Sheets

(56) References Cited

U.S. PATENT DOCUMENTS 5,977,640 A 11/1999 Bertin et al.
6,031,284 A 2/2000 Song
6,038,133 A 3/2000 Nakatani et al.
6,159,767 A 12/2000 Eichelberger
6,222,265 B1 4/2001 Akram et al.
6,335,571 B1 1/2002 Capote et al.
6,348,728 B1 2/2002 Aiba et al.
6,396,148 B1 5/2002 Eichelberger et al.
6,407,929 B1 6/2002 Hale et al.
6,426,545 B1 7/2002 Eichelberger et al.
6,445,075 B1 9/2002 Scanlan et al.
6,476,503 B1 11/2002 Imamura et al.
6,489,685 B2 12/2002 Asahi et al.
6,507,115 B1 1/2003 Hofstee et al.
6,538,210 B2 3/2003 Sugaya et al.
6,555,908 B1 4/2003 Eichelberger et al.
6,607,938 B2 8/2003 Kwon et al.
6,633,081 B2 10/2003 Sahara et al.
6,714,418 B2 3/2004 Frankowsky et al.
6,759,268 B2 7/2004 Akagawa
6,770,971 B2 8/2004 Kouno et al.
6,774,467 B2 8/2004 Horiuchi et al.
6,784,530 B2 8/2004 Sugaya et al.
6,818,544 B2 11/2004 Eichelberger et al.
6,838,750 B2 1/2005 Nuytkens et al.
6,885,099 B2 4/2005 Ogawa
6,888,209 B2 5/2005 Jobetto
6,939,738 B2 9/2005 Nakatani et al.
6,946,325 B2 9/2005 Yean et al.
6,958,537 B2 10/2005 Eng et al.
7,034,386 B2 4/2006 Kurita
7,049,692 B2 5/2006 Nishimura et al.
7,112,467 B2 9/2006 Eichelberger et al.
7,242,081 B1 7/2007 Lee
7,355,290 B2 4/2008 Shioga et al.
7,365,416 B2 4/2008 Kawabata et al.
7,514,335 B2 4/2009 Wakabayashi et al.
7,615,411 B2 11/2009 Jobetto
7,619,901 B2 11/2009 Eichelberger et al.
7,633,765 B1 12/2009 Scanlan et al.
7,791,206 B2 9/2010 Takeuchi et al.
7,795,721 B2 9/2010 Kurita
7,830,000 B2 11/2010 Eichelberger et al.
7,863,090 B2 1/2011 Eichelberger et al.
7,868,445 B2 1/2011 Kohl et al.
8,169,065 B2 5/2012 Kohl et al.
8,324,020 B2 12/2012 Eichelberger et al.
8,334,590 B1 12/2012 Jung et al.
8,384,199 B2 2/2013 Eichelberger et al.
8,474,133 B2 7/2013 Eichelberger et al.
8,533,941 B2 9/2013 Eichelberger et al.
8,564,119 B2 10/2013 Eichelberger et al.
8,590,145 B2 11/2013 Eichelberger et al.
8,901,730 B2 * 12/2014 Liu ..... H01L 23/488 257/698
2002/0034066 A1 * 3/2002 Huang et al. ..... 361/704
2002/0152610 A1 10/2002 Nishiyama et al.
2003/0122240 A1 7/2003 Lin et al.
2003/0137045 A1 7/2003 Sugaya et al.
2003/0205826 A1 11/2003 Lin et al.
2004/0000425 A1 1/2004 White et al.
2004/0150081 A1 8/2004 Ogawa
2004/0150097 A1 8/2004 Gaynes et al.
2004/0195686 A1 10/2004 Jobetto et al.
2004/0212099 A1 10/2004 Klein et al.
2004/0227258 A1 11/2004 Nakatani
2005/0001329 A1 1/2005 Matsuki et al.
2005/0006784 A1 1/2005 Nakayama
2005/0046039 A1 3/2005 Yang et al.
2005/0051886 A1 3/2005 Mihara et al.
2005/0101116 A1 5/2005 Tseng
2005/0184377 A1 8/2005 Takeuchi et al.
2005/0224988 A1 10/2005 Tuominen
2005/0269681 A1 12/2005 Asahi et al.
2006/0022332 A1 2/2006 Koyama et al.
2006/0121718 A1 6/2006 Machida et al.
2006/0125082 A1 6/2006 Wakabayashi et al.
2006/0255458 A1 11/2006 Dangelmaier
2007/0052083 A1 3/2007 Kobayashi et al.
2007/0069389 A1 3/2007 Wollanke et al.
2007/0096292 A1 5/2007 Machida
2007/0141751 A1 * 6/2007 Mistry ..... H01L 21/561 438/109
2007/0164457 A1 7/2007 Yamaguchi et al.
2007/0246806 A1 10/2007 Ong et al.
2007/0246811 A1 10/2007 Tsai et al. ..... H01L 25/50 257/678
2008/0157328 A1 * 7/2008 Kawata ..... H01L 21/561 257/686
2008/0237834 A1 10/2008 Hu et al.
2009/0135977 A1 5/2009 Sheu
2010/0244219 A1 * 9/2010 Pagaila ..... H01L 21/568 257/686
2011/0006433 A1 * 1/2011 Kanetaka ..... H05K 3/3436 257/773
2011/0068481 A1 * 3/2011 Park et al. ..... 257/777
2011/0117700 A1 5/2011 Weng et al.
2011/0149493 A1 * 6/2011 Kwon et al. ..... 361/679.02
2013/0113097 A1 * 5/2013 Yu ..... H01L 24/14 257/738

* cited by examiner

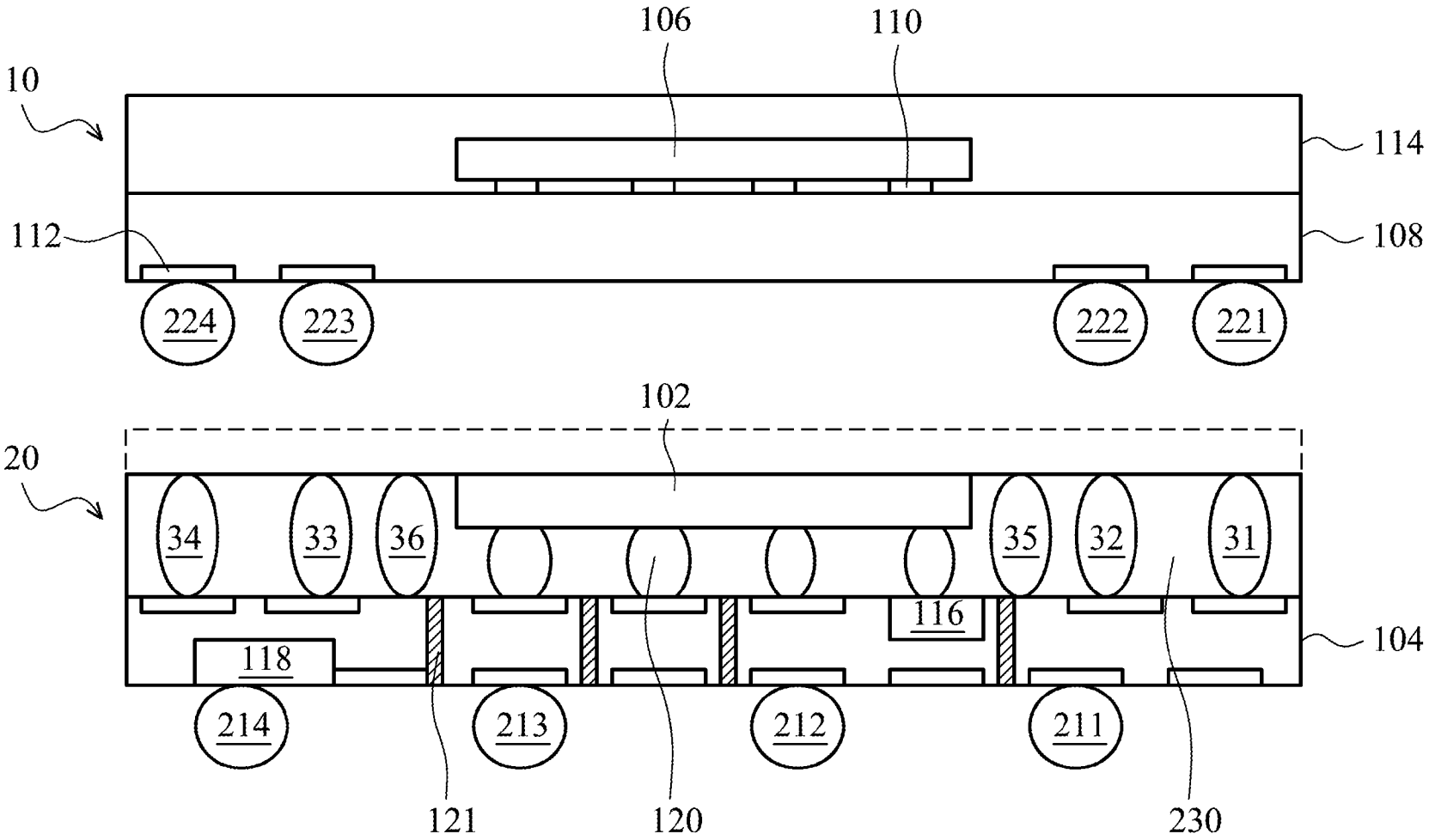
Figure 1(e)
(Amended)

METHODS AND APPARATUS FOR PACKAGE ON PACKAGE DEVICES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a reissue application of U.S. Pat. No. 9,373,599.*

This application is a continuation application of patent application Ser. No. 13/463,667, entitled "Methods and Apparatus for Package on Package Devices," filed on May 3, 2012, which application is incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These smaller electronic components also require smaller packages that utilize less area than previous packages. Some smaller types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Package on package (PoP) technology is becoming increasingly popular for its ability to allow for denser integration of integrated circuits into a small overall package. PoP technology is employed in many advanced handheld devices, such as smart phones.

In a PoP device, individual semiconductor dies may be packaged either separately or with multiple semiconductor dies in each separate individual package, and then the separate individual packages may be brought together and interconnected to form a PoP device so that the individual semiconductor dies in the separate individual packages may be integrated together in order to perform desired tasks. The separate individual packages may be electrically interconnected to each other, for example, by using contact bumps or other connectors. The heat dissipation and warpage control for PoP devices are issues to consider.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1(a)-1(e) illustrate cross-sectional views of a package on package (PoP) device and a method for forming such a device in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

As will be illustrated in the following, methods and apparatus for a package-on-package (PoP) device are disclosed. In short, an embodiment of a PoP device is formed by connecting a top package and a bottom package together using a plurality of PoP connectors on the bottom package connected to corresponding connectors of the top package. The PoP device further comprises a plurality of dummy connectors. A dummy connector is placed on the bottom package and is not connected to any corresponding connector in the top package. Therefore a dummy connector is not used for connection purposes. Instead, a dummy connector is used to reduce the molding compound volume in order to reduce the device warpage. Moreover, the dummy connector is made of metal, and can improve heat dissipation and stress redistribution. The dummy connector may be formed at the same time as the PoP connectors are formed.

Figure 1A:
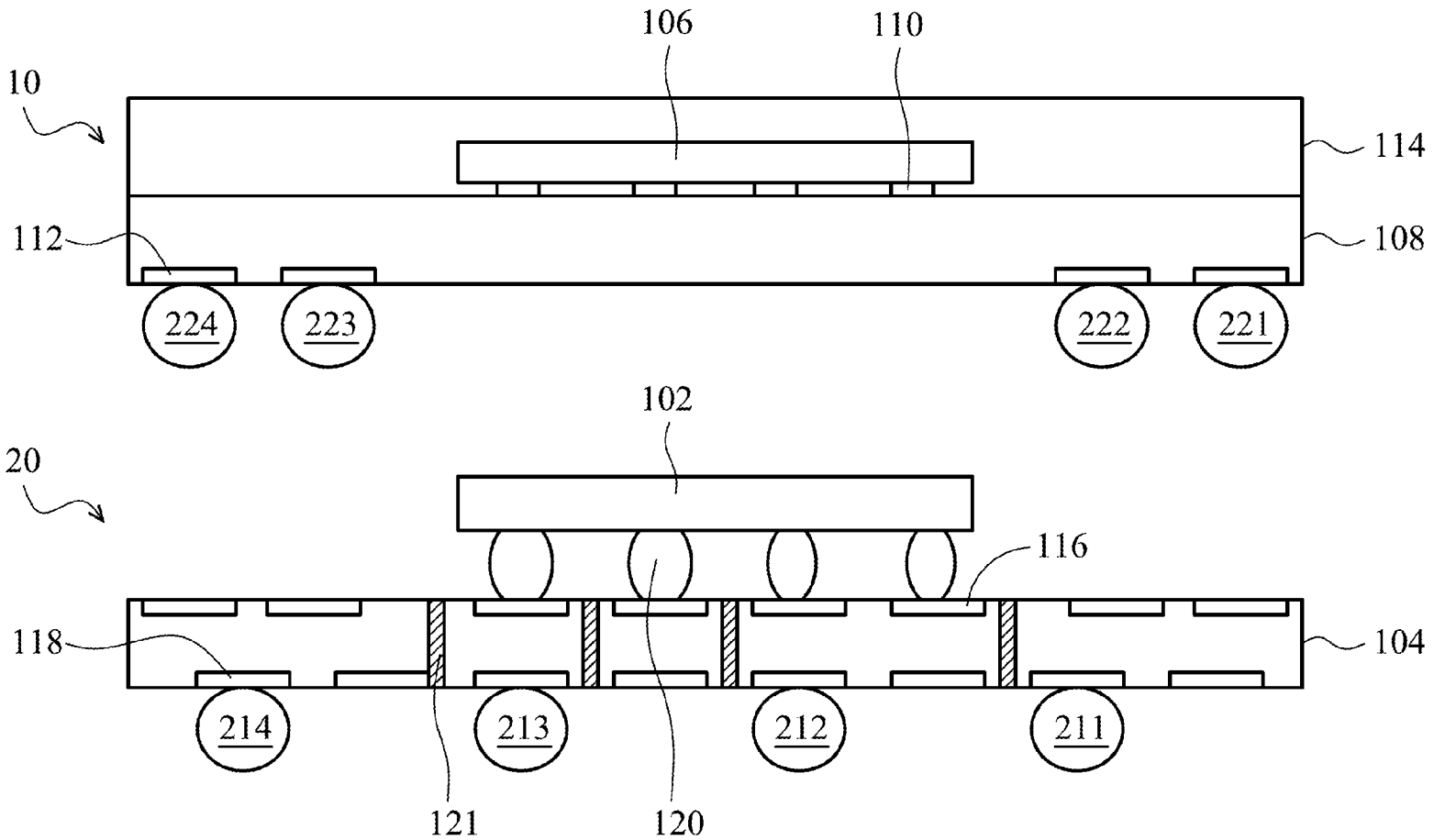
Figure 1B:
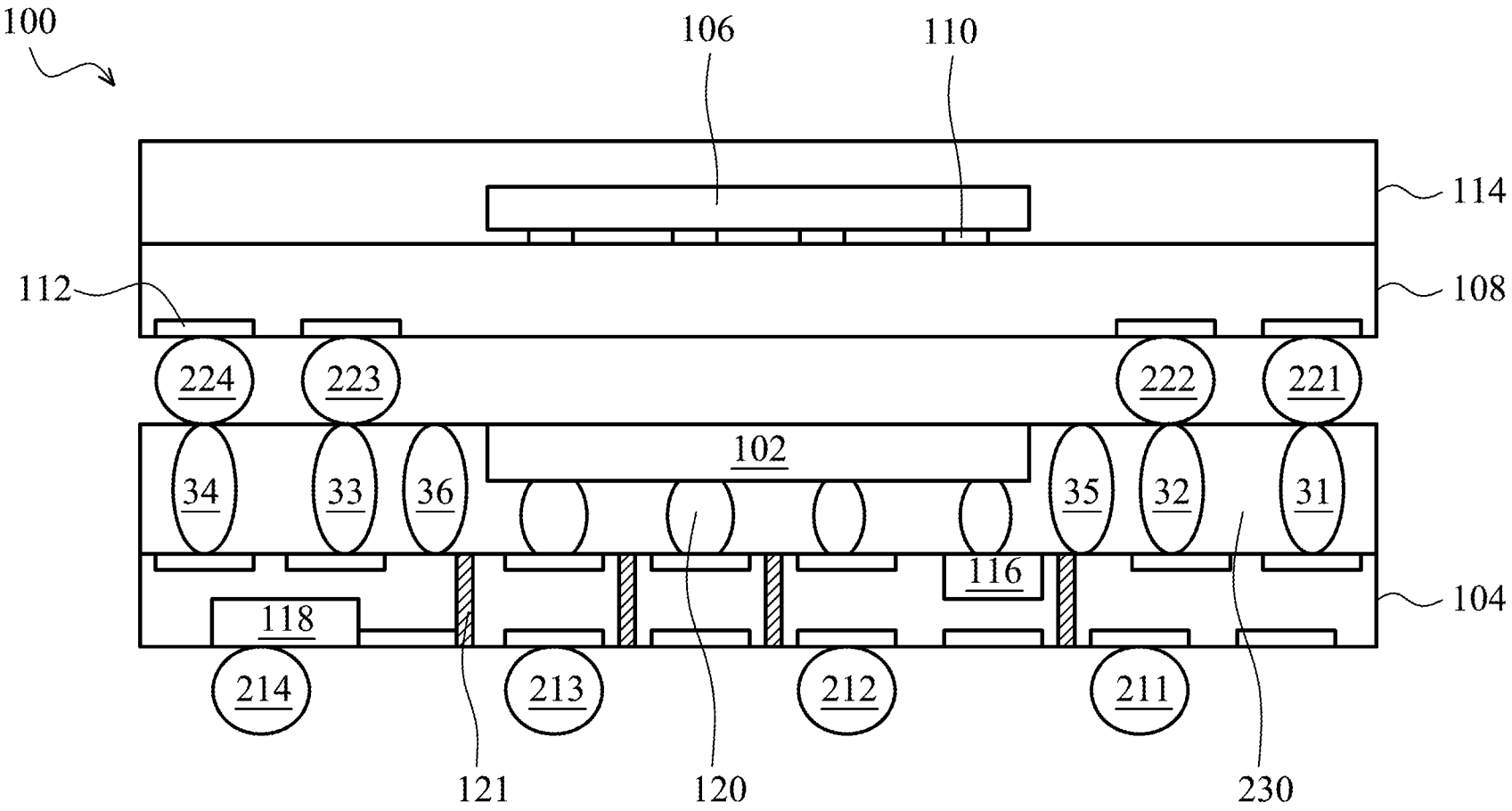
Figure 1C:
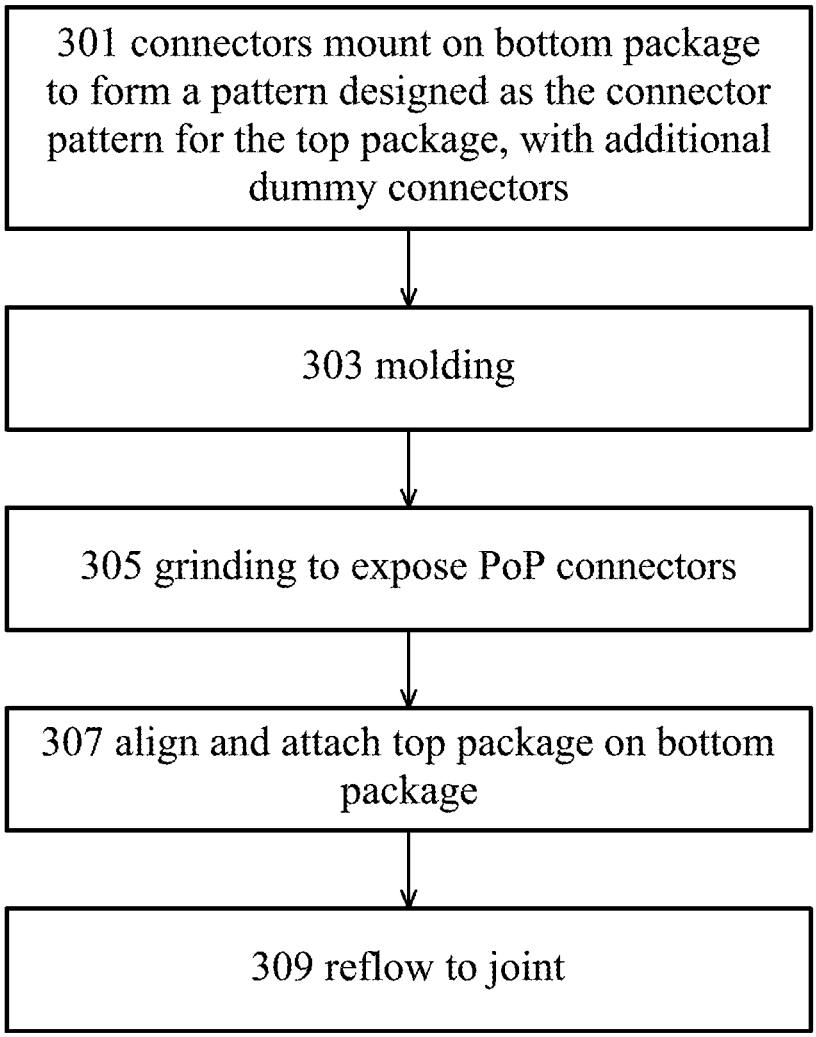
Figure 1D:
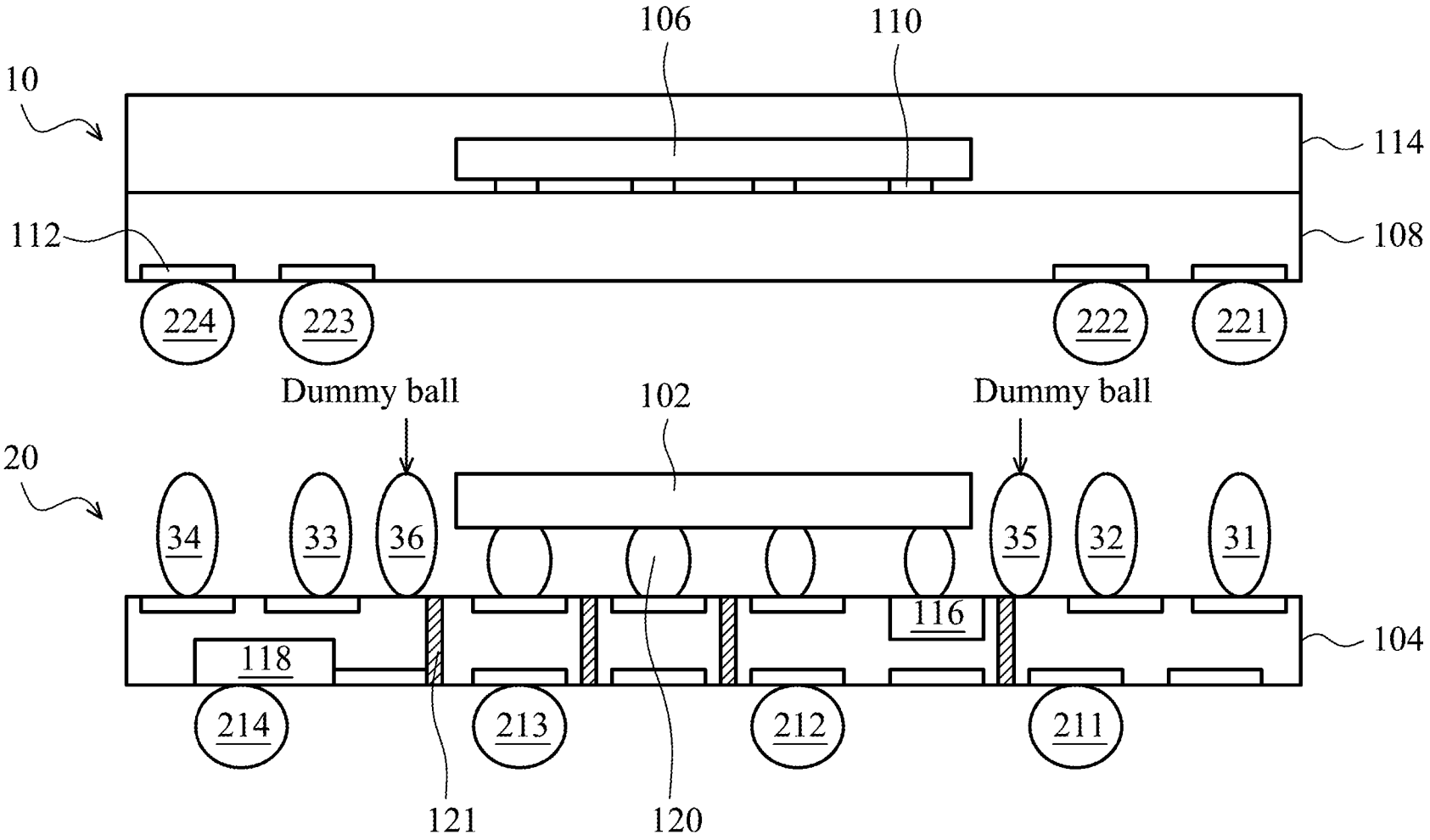

FIG. 1(a) illustrates a cross-sectional view of two individual packages 10 and 20, connected together to form a PoP device 100 as illustrated in FIG. 1(b) in accordance with an embodiment, using an exemplary method illustrated in FIG. 1(c). More detailed intermediate steps are illustrated in FIGS. 1(d) and 1(e).

As illustrated in FIG. 1(a), a first package 10, which may be a top package, has a first substrate 108. A first integrated circuit (IC) die 106 is mounted on one surface of the substrate 108, which may be the top surface of the substrate, via a set of conductive connectors 110. Through vias (TVs) (not shown) may be used to provide electrical connections between the first die 106 and another set of conductive connectors 112 such as bond pads on an opposing surface of the substrate 108, which may be the bottom surface of the substrate. An encapsulant or mold 114 may be formed over the components to protect the components from the environment and external contaminants. A plurality of connectors such as solder balls 221 to 224 may be formed on the bottom surface of the first substrate 108. The connectors 221 to 224 may be used to connect to another package, such as a bottom package 20. The connectors 221 to 224 are attached to the connectors 112, which may be bond pads, on the bottom of the first substrate 108. The number of connectors such as 112, 110, and the number of connectors such as 221 to 224 are only for illustrative purposes, and is not limiting. A connector may be a bond pad such as a connector 112 or a solder ball such as a connector 221. As long as a component may provide an electronic connection, the component may be called a connector. There may be other number of connectors for the package 10.

The first package 10 may package the die 106 using a flip-chip wafer level package (WLP) and wire bonding technique, or using a flip-chip and bump-on-trace (BOT) technique. Alternative package techniques may be used to form the package 10. The substrate 108 may also include redistribution lines (RDLs) (not shown) within and/or on one or both surfaces of the substrate 108 to allow for a different pin configuration as well as larger electrical connections. The substrate 108 may be, for example, a packaging substrate, a printed-circuit board, a high-density interconnect, or the like. The die 106 may be a memory chip or a logic chip, for example. The set of connectors 110 and 112 may comprise, for example, contact pads, lead free solder, eutectic lead, conductive pillars, combinations thereof, and/or the like. If the connectors 221 to 224 are solder balls, they may be formed using a ball mount process, followed by a solder reflow process. The connectors 221 to 224 may alternatively be formed using other methods.

A second package 20, which may be called a bottom package, comprises a second substrate 104 with a second IC die 102 mounted thereon on one surface of the substrate, which may be the top surface of the substrate 104. The second die 102 may be of a logic function. The substrate 104 is connected to the die 102 by a set of connectors 116 and 120. The connectors 116 may be bond pads and the connectors 120 may be a plurality of solder balls, which together form the connections between the die 102 and the substrate 104. Another set of connectors 118 may be formed along an opposing surface of the second substrate 104 from the die 102, which may be the bottom surface. TSVs 121 in the second substrate 104 may provide an electrical connection among the connectors 116 and the connectors 118. A plurality of connectors such as solder balls 211 to 214 may be formed on the bottom surface of the substrate 104. The substrate 104 may also include RDLs (not shown) within and/or on one or both surfaces of the second substrate 104 to allow for a different pin configuration as well as larger electrical connections.

In an embodiment, the substrate 104 may be any suitable substrate, such as a silicon substrate, an organic substrate, a ceramic substrate, a dielectric substrate, a laminate substrate, or the like. The connectors 116, 120, and 118 may comprise, for example, contact pads, lead free solder, eutectic lead, conductive pillars, combinations thereof, and/or the like. The die 102 may be any suitable integrated circuit die for a particular application. For example, the die 102 may be a memory chip, such as a DRAM, SRAM, NVRAM, or a logic circuit. There is only die 102 shown in FIGS. 1(a) and 1(b). However, there may be a plurality of dies on the substrate 104. Similarly, there may be a plurality of dies on the substrate 108 as well.

The first package 10 and the second package 20 may be electrically coupled to form a package-on-package (PoP) device 100 as shown in FIG. 1(b). A set of connectors such as 31 to 36 may be formed on the top surface of the substrate 104, which is the same surface where the die 102 is mounted. The connectors 31 to 34, which may be called as PoP connectors, are formed according to the pattern of the connectors 221 to 224 of the top package 10, meaning PoP connectors 31 to 34 are aligned with connectors 221 to 224, respectively. The connectors 35 and 36 are extra connectors, sometimes referred to herein as dummy connectors, that do not correspond to and are not connected to any connectors of the top package 10. The connectors 31 to 34 may be further connected to some bond pads on the substrate 104, which are connected to other internal functions of the chip 102 or the substrate 104. The connectors 35 and 36 on the other hand, may not be connected to any other functions or bond pads. All the connectors 31 to 36 are further covered by an encapsulant or mold 230 to protect the components from the environment and external contaminants. The encapsulant 230 is then grinded to expose the connectors 31 to 34. Afterwards, the top package 10 may be aligned and attached so that the connectors 31 to 34 are connected to the connectors 221 to 224 in an one to one correspondence fashion.

The connectors 35 and 36 illustrated in FIG. 1(b) are called dummy connectors, or dummy balls. In short, a dummy connector at a bottom package is a connector that is not connected to any corresponding connector in the top package, therefore a dummy connector or a dummy ball is not used for connection purposes as the PoP connectors are. Instead, dummy connectors are used to reduce the molding compound volume in order to reduce the package warpage. Moreover, the dummy connectors are made of metals, and they can improve heat dissipation and stress redistribution.

FIG. 1(c) illustrates a flow chart of an exemplary process of packaging semiconductor devices in accordance with an embodiment of the present disclosure. In step 301, a plurality of connectors such as solder balls is mounted on a surface of a substrate of the bottom package, which may be the top surface of the substrate. Some connectors form a pattern designed as the connector pattern for the top package, which are called PoP connectors. Some other connectors are dummy connectors not corresponding to the pattern of the connectors for the top package. In step 303, the substrate surface with the connectors, both the PoP connectors and the dummy connectors, are molded with an encapsulant such as molding materials. In step 305, the encapsulant is grinded to expose the PoP connectors so that they can be connected to the connectors of the top package. Dummy connectors may be exposed by this process as well. In step 307, the top package is aligned so that the connectors of the top package are placed on top of the PoP connectors of the bottom package and connections to the PoP connectors can be made. Afterwards, in step 309, the formed package is reflowed to form connections between the PoP connectors and the connectors of the top package.

FIG. 1(d) illustrates an example step 301 showing a set of connectors such as 31 to 36 may be formed on the top surface of the substrate 104 of the bottom package 20. The connectors 31 to 34 are PoP connectors, which are formed according to the pattern of the connectors 221 to 224 of the top package 10. The connectors 35 and 36 are the dummy connectors which do not correspond to any connectors of the top package 10. The connectors 31 to 34 may be further connected to some connectors on the substrate 104, which are connected to other internal functions of the chip 102 or the substrate 104. The connectors 35 and 36 on the other hand, may not be connected to any other functions. The connectors or the balls 31 to 36 may comprise a material such as tin, or other suitable materials, such as silver, lead-free tin, copper, combinations thereof, or the like.

FIG. 1(e) illustrates an example step 303 showing the formation of a molding encapsulant 230 applied on the second substrate 104 in accordance with an embodiment. In an embodiment, the molding encapsulant 230 is a molding underfill (MUF) comprising, for example, a polymer, epoxy, and/or the like. The molding encapsulant 230 may be molded onto the die 102 and the substrate 104 using, for example, compressive molding or transfer molding. The molding encapsulant 230 may be in contact with the top surface and the edges of the die 102. In one embodiment, a top surface of the molding encapsulant 230 may be coplanar with a top surface of the die 102. In other embodiments, a top surface of the molding encapsulant 230 may be higher than a top surface of the die 102 such that the die 102 may be fully encapsulated in the molding encapsulant 230.

At step 305, a grinding or polishing process may be performed to remove portions of the molding encapsulant 230 from over a top surface of the die 102 to expose the die 102. The molding encapsulant 230 is also grinded to expose the PoP connectors 31 to 34 so that they can be connected to the connectors of the top package. In addition, not shown, a flux may be applied to the surface of the molding encapsulant 230 and the connectors 31 to 34. The flux helps clean the surface of the molding encapsulant 230 and the PoP connectors 31 to 34, thereby aiding in formation of an electrical contact between the PoP connectors 31 to 34 and the connectors 221 and 224. The flux may be applied by, for example, in a dipping operation in which the surface of the molding compound 230 and the connectors 31 to 34 is dipped in a flux.

In step 307, the top package is aligned so that the connectors 221 to 224 of the top package are placed on top of the PoP connectors 31 to 34 of the bottom package. The method includes coupling each of the plurality of connectors 221 to 224 of the top package to one of the plurality of connectors 31 to 34 on the top surface of the second substrate of the bottom package.

Afterwards, in step 309, the formed package is reflowed to form connections between the PoP connectors 31 to 34 of the bottom package and the connectors 221 to 224 of the top package. In an embodiment, the reflow process is performed using an induction reflow process. In other embodiments, however, other reflow processes may also be used. The result is a PoP device as shown in FIG. 1(b).

Figures 2A, 2B:
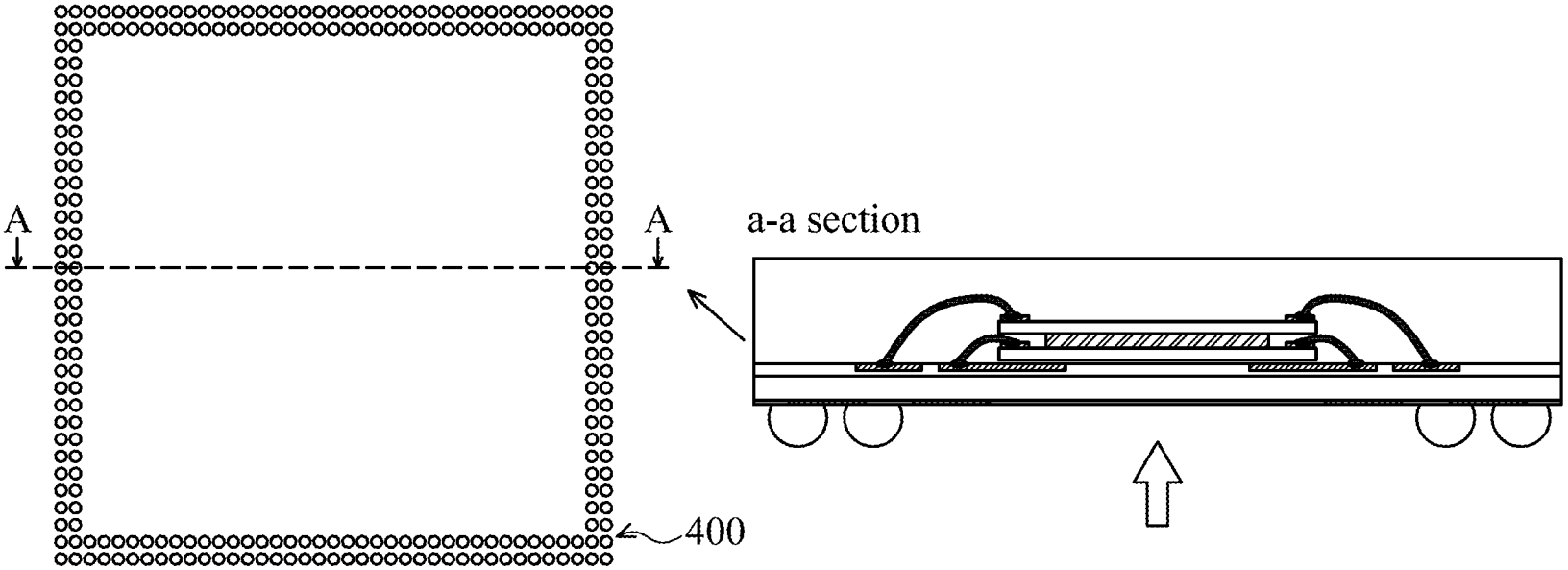
FIGS. 2(a)-2(e) illustrate cross-sectional views and top views of additional embodiments of PoP devices.

Following a similar process, further embodiments may be constructed. FIGS. 2(a)-2(e) illustrate cross-sectional views and top views of additional embodiments of PoP devices. FIG. 2(a) is a top view of the top package, while FIG. 2(b) shows the cross-section view of the top package. The top package may be packaged using a flip-chip WLP and wire bonding technique, or using a flip-chip and BOT technique. Alternative package techniques may be used to form the top package.

Figure 2D:
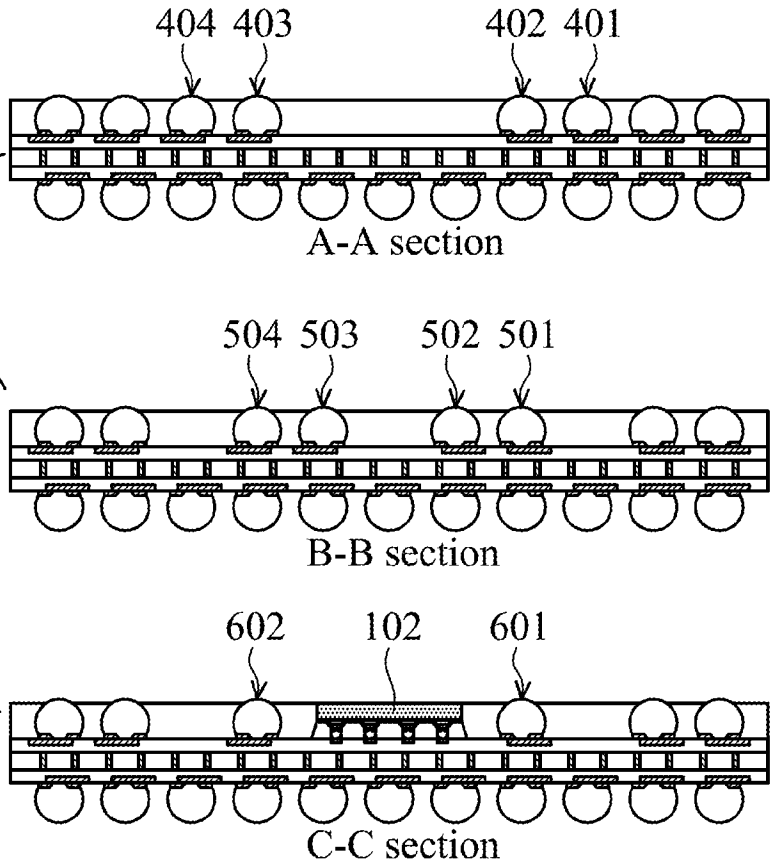
Figure 2C:
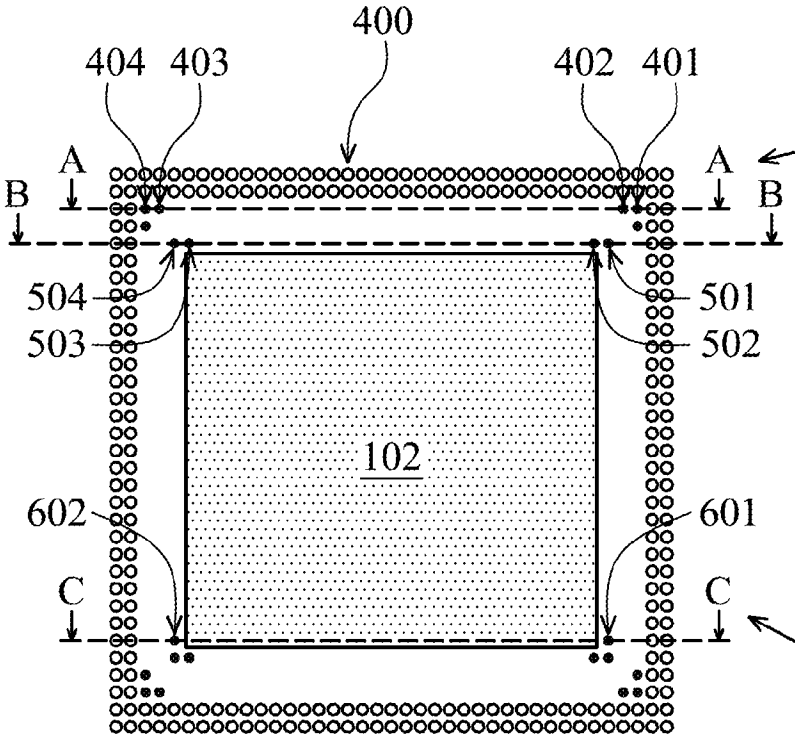
Figure 2E:
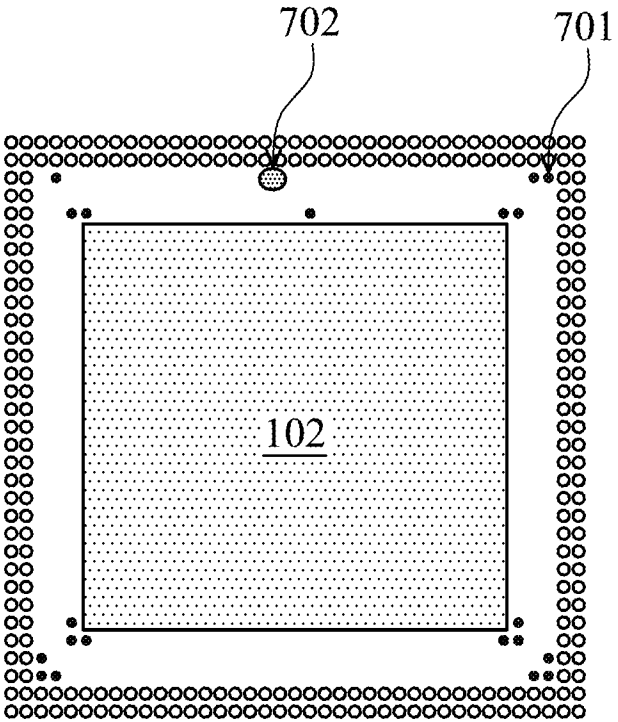

FIGS. 2(c) and 2(e) illustrate top views of the bottom package of a PoP device, while FIG. 2(d) illustrates a cross-section view of the bottom package. The bottom package has two rows of PoP connectors 400, which may be ball arrays, surrounding the peripheral region of the substrate of the bottom package, forming two rings, corresponding to the connectors 400 of the top package shown in FIG. 2(a). A plurality of dummy connectors 401 to 404, 501 to 504, and 601 to 602 may be placed on the top surface of the bottom package. The number of dummy connectors is only for illustration purposes and is not limiting. Alternatively, other numbers of balls may be used.

The dummy connectors 401 to 404 aligned on line A are placed close to the PoP connectors. FIG. 2(d) shows the cross section view of the four dummy balls 401 to 404 formed, together with two PoP connectors on each side. The connectors 501 to 504 aligned on line B are placed close to the chip 102. FIG. 2(d) shows the cross section view of the four dummy connectors 501 to 504 formed, together with two PoP connectors on each side. The connectors 601 to 602 aligned on line C are placed close to chip 102, and a cross section view of the connectors 601 and 602 also include the chip 102. The connectors 601 and 602 are also surrounded by the two PoP connectors on each side.

FIG. 2(e) further illustrates a top view of the bottom package for an embodiment of a PoP device, wherein a plurality of dummy connectors is formed. Some of the dummy connectors are placed around the rings of the PoP connectors, while some others are placed in the middle positions. Some of the dummy connectors such as connectors 701 may be smaller than some other dummy connectors 702.

It should be understood that the above description provides a general description of embodiments and that embodiments may include numerous other features. For example, embodiments may include under bump metallization layers, passivation layers, molding compounds, additional dies and/or substrates, and the like. Additionally, the structure, placement, and positioning of the die 106 and the die 102 are provided for illustrative purposes only, and accordingly, other embodiments may utilize different structures, placements, and positions.

It should also be understood that the ordering of the various steps discussed above are provided for illustrative purposes only, and as such, other embodiments may utilize different sequences. These various orderings of the step are to be included within the scope of embodiments.

Thereafter, other normal processes may be used to complete the device 100. For example, the second substrate 104 may be attached to yet another substrate, such as a printed circuit board (PCB), a high-density interconnect, a silicon substrate, an organic substrate, a ceramic substrate, a dielectric substrate, a laminate substrate, another semiconductor package, or the like.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:

a first substrate;

a first die attached to a first surface of the first substrate;

a second substrate attached to the first substrate, the first die being interposed between the first substrate and the second substrate;

one or more signaling connectors interposed between the first substrate and the second substrate; and a plurality of dummy connectors interposed between the first substrate and the second substrate, the plurality of dummy connectors not passing electrical signals between the first substrate and the second substrate, the plurality of dummy connectors being connected to only one of first substrate and the second substrate, wherein a first dummy connector is a different size than a second dummy connector.

2. The device of claim 1, further comprising one or more intermediate connectors electrically coupling the one or more signaling connectors to the second substrate.

3. The device of claim 2, wherein the one or more intermediate connectors comprise solder balls.

4. The device of claim 1, further comprising an encapsulant, wherein the first die is exposed through the encapsulant.

5. The device of claim 4, wherein the encapsulant encircles the plurality of dummy connectors and the one or more signaling connectors.

6. The device of claim 1, further comprising an encapsulant, wherein the encapsulant covers [an upper surface of] the first die.

7. The device of claim 1, wherein the first dummy connector of the plurality of dummy connectors is of a different size from a first signaling connector of the one or more signaling connectors.

8. The device of claim 1, wherein the one or more signaling connectors comprise a plurality of signaling connectors arranged in a pattern, and wherein the plurality of dummy connectors comprise a first number of dummy connectors in a first corner of the pattern and a second number of dummy connectors in a second corner of the pattern, the first number being different than the second number.

9. A device comprising:

a first substrate;

a first die attached to a first surface of the first substrate;

a second substrate attached to the first substrate, the first die being interposed between the first substrate and the second substrate;

an encapsulant on the first surface of the first substrate, the encapsulant extending to at least an upper surface of the first die, an uppermost surface of the encapsulant being spaced apart from the second substrate;

one or more first connectors extending through the encapsulant to the first substrate, the one or more first connectors electrically coupling the first substrate to the second substrate, *wherein the encapsulant has a first height and the one or more first connectors have the first height and wherein the one or more first connectors have curved sidewalls from a first side of the encapsulant to a second side of the encapsulant*;

[one] *two* or more dummy connectors extending through the encapsulant to the first substrate, the [one] *two* or more dummy connectors interposed between the first substrate and the second substrate, the [one] *two* or more dummy connectors not being electrically coupled between a conductive element and *the* first substrate; and one or more second connectors extending between corresponding ones of the one or more first connectors and the second substrate, *wherein a first dummy connector is a different size than a second dummy connector*.

10. The device of claim 9, wherein the encapsulant covers the first die.

11. The device of claim 9, wherein the [one] *two* or more dummy connectors are exposed through the encapsulant.

12. The device of claim 9, wherein the one or more first connectors are arranged a pattern around a periphery of the first substrate, the one or more first connectors being placed around the first die, the first die being spaced apart from the one or more first connectors, wherein a first one of the [one] *two* or more dummy connectors is placed at a corner of the first die and a second one of the [one] *two* or more dummy connectors is placed at a corresponding corner of the pattern of the one or more first connectors.

[13. The device of claim 9, wherein a first dummy connector is a different size than a second dummy connector.]

14. A method comprising:

providing a first substrate;

attaching a first die to the first substrate;

forming an encapsulant layer over the first substrate, *wherein after the forming the encapsulant layer* the encapsulant layer [having] *has* a signaling connector and a *first* dummy connector extending through *an encapsulant of* the encapsulant layer to the first substrate, the encapsulant layer being interposed between the signaling connector, the *first* dummy connector and the first die, *wherein the encapsulant layer comprises a first material that has a straight sidewall which extends from a first side of the encapsulant layer to an opposite side of the encapsulant layer, the opposite side being in physical contact with the first substrate, wherein a second dummy connector extends through the encapsulant layer to the first substrate, the second dummy connector being a different size than the first dummy connector*;

removing a portion of the encapsulant layer to expose the signaling connector and the *first* dummy connector; and attaching a second substrate to the signaling connector, wherein the *first* dummy connector is electrically isolated from electrical devices on the second substrate.

15. The method of claim 14, wherein an upper surface of the first die is exposed through the encapsulant layer.

16. The method of claim 14, wherein the encapsulant *layer* is in contact with a top surface and sidewalls of the first die.

17. The device of claim 14, wherein the *first* dummy connector provides no electrical connection between a conductive element and conductive pad on the first substrate.

18. The method of claim 14, wherein the removing the portion of the encapsulant *layer* exposes surface of the first die.

19. The method of claim 18, wherein the attaching the second substrate to the signaling connector comprises attaching the signaling connector to the second substrate using an intermediate connector, the intermediate connector protruding from the second substrate.

20. The method of claim 19, wherein the intermediate connector is a solder ball.

*21. A device comprising:*

*a first substrate;*

*a first die attached to a first surface of the first substrate;*

*an encapsulant on the first surface of the first substrate, the encapsulant extending to at least an upper surface of the first die facing away from the first substrate, the encapsulant having a straight sidewall extending between a first side of the encapsulant to a second side of the encapsulant;*

*one or more first connectors extending through the encapsulant to the first substrate, wherein at least one of the one or more first connectors comprises a first material in physical contact with the first substrate, the first material extending to a point located within the encapsulant;*

*two or more dummy connectors extending through the encapsulant to the first substrate, the two or more dummy connectors not being electrically coupled between a conductive element and first substrate; and*

*one or more second connectors extending over corresponding ones of the one or more first connectors, wherein a first dummy connector is a different size than a second dummy connector.*

*22. The device of claim 21, wherein the encapsulant covers the first die.*

*23. The device of claim 21, wherein the two or more dummy connectors are exposed through the encapsulant.*

*24. The device of claim 21, wherein the one or more first connectors are arranged a pattern around a periphery of the first substrate, the one or more first connectors being placed around the first die, the first die being spaced apart from the one or more first connectors, wherein a first one of the two or more dummy connectors is placed at a corner of the first die and a second one of the two or more dummy connectors is placed at a corresponding corner of the pattern of the one or more first connectors.*

*25. A device comprising:*

*a first package comprising a first die placed on a first surface of a first substrate and a first connector connected to a second surface of the first substrate; and*

*a second package comprising a second die, a second connector and a dummy connector, the second connector and the dummy connector extending through an encapsulant, the encapsulant being interposed between the dummy connectors and the second die, the encapsulant being non-conductive, wherein the dummy connector has a curved sidewall extending from a first side of the encapsulant to a second side of the encapsulant;*

*wherein the first connector is connected to the second connector, and the dummy connector is not electrically connected to the first package, wherein the dummy connector is of a different size from a size of the second connector.*

*26. The device of claim 25, further comprising a first plurality of connectors connected to the second surface of the first substrate, a second plurality of connectors, and a third plurality of dummy connectors, wherein any of the first plurality of connectors is connected to one of the second plurality of connectors, none of the third plurality of dummy connectors is connected to any connector of the first package.*

*27. The device of claim 25, wherein the first connector is connected to a bottom surface of the first substrate and the first die is placed on a top surface of the first substrate.*

*28. The device of claim 25, wherein the first substrate is selected from a group consisting essentially of a packaging substrate, a printed-circuit board, and a high-density interconnect.*

*29. The device of claim 25, wherein the first die is a memory chip or a logic chip.*

*30. The device of claim 25, wherein the first substrate comprises a redistribution line (RDL) on a surface of the first substrate.*

*31. The device of claim 25, wherein the second package comprises a plurality of dies.*

*32. The device of claim 25, wherein the second die is a memory chip or a logic chip.*

*33. The device of claim 25, wherein the second connector comprises copper.*

*34. The device of claim 25, wherein the dummy connector comprise copper.*

*35. A device comprising:*

*a first die attached to a first surface of a first redistribution structure;*

*an encapsulant in physical contact with the first surface, the encapsulant extending to at least an upper surface of the first die facing away from the first surface, the encapsulant comprising a first material throughout the encapsulant, the first material having a first external sidewall which is straight from a first surface of the encapsulant to a second surface of the encapsulant opposite the first surface;*

*one or more first connectors extending through the encapsulant to the first surface of the first redistribution structure; and*

*two or more dummy connectors extending through the encapsulant to the first surface of the first redistribution structure, the two or more dummy connectors not being electrically coupled between a conductive element and the first surface, wherein a first dummy connector is a different size than a second dummy connector.*

*36. The device of claim 35, wherein the encapsulant covers the first die.*

*37. The device of claim 35, wherein the two or more dummy connectors are exposed through the encapsulant.*

*38. The device of claim 35, wherein the one or more first connectors are arranged a pattern around a periphery of the first substrate, the one or more first connectors being placed around the first die, the first die being spaced apart from the one or more first connectors, wherein a first one of the two or more dummy connectors is placed at a corner of the first die and a second one of the two or more dummy connectors is placed at a corresponding corner of the pattern of the one or more first connectors.*

* * * * *